United States Patent [19]

Clark et al.

[11] Patent Number: 4,829,526
[45] Date of Patent: May 9, 1989

[54] DATA TRANSMISSION

[75] Inventors: Alan D. Clark; Abdullah Hashim, both of Leicester, England

[73] Assignee: British Telecommunications Public Limited Company, United Kingdom

[21] Appl. No.: 945,097

[22] Filed: Nov. 4, 1986

[30] Foreign Application Priority Data

Mar. 4, 1985 [GB] United Kingdom ................. 8505514
Mar. 4, 1985 [GB] United Kingdom ................. 8505515

[51] Int. Cl.⁴ ............................................. G06F 11/10
[52] U.S. Cl. ......................................... 371/40; 371/35
[58] Field of Search .................... 371/35, 37, 39, 40, 371/41; 358/261

[56] References Cited

U.S. PATENT DOCUMENTS

| 3,237,170 | 2/1966 | Blasbalg. | |
|---|---|---|---|
| 3,506,961 | 4/1970 | Abramson | 371/40 |
| 3,657,700 | 4/1972 | Lutzker | 371/41 X |
| 3,748,379 | 7/1973 | Epstein et al. | |
| 4,276,646 | 6/1981 | Haggard | 371/40 X |
| 4,580,162 | 4/1986 | Mori | 358/261 X |

FOREIGN PATENT DOCUMENTS 0117287 9/1984 European Pat. Off. .
2061575 5/1981 United Kingdom .

OTHER PUBLICATIONS

I.B.M. Journal of Research and Development, vol. 24, No. 1, Jan. 1980 New York, (US) A. M. Patel: "Error Recovery Scheme for the IBM 3850 Main Storage System", pp. 32-42, see p. 33, right-hand column, last paragraph-p. 34 left-hand column, line 19, FIG. 1.
Telecom Report, vol. 2, No. 6, Dec. 1979, Munich, (DE) F. Hlawa et al.: "Der Zentrale Zeichenkanal nach dem CCITT-System" No. 7, see Figures 2-5.
Proceedings of the Fall Joint Computer Conference, Anaheim, Calif., Dec. 5-7, 1972, AFIPS Press, Montvale, N.Y., (US) W. T. Wilner; "Burroughs B1700 Memory Utilization", pp. 579-586, see p. 581, left-hand column, line 36 right-hand column, last line: p. 580, Time-Base Representation.
IEEE Transactions on Communications, vol. COM-22, No. 6, Jun. 1974, New York, (US) P. D. Shaft: "A Source Encoding Algorithm for Quantized Data", see Table I; p. 867.
IBM Journal of Research and Development, vol. 18, No. 2, Mar. 1973; New York, (US) L. R. Bahl et al.: "Image Datacompression by Predictive Coding. II: Encoding Algorithms", pp. 172-179, see p. 175.
Patents Abstracts of Japan, vol. 6, No. 212, Oct. 26, 1982, pp. 156-151 & JP, A, 57120154 (Kokusai Deshin Denwa K.K.) Jul. 27, 1982, see Figures.
IBM Technical Disclosure Bulletin, vol. 24, No. 6, Nov. 1981, New York, (US) S. Lin et al.: "Preventive Error Control Scheme", pp. 2886-2891.
IBM Technical Disclosure Bulletin, vol. 24, No. 5, Oct. 1981, New York, (US) D. T. Tang et al.: "Error Detection with Embedded Forward Error Correction", pp. 2469-2472.
Patents Abstracts of Japan, vol. 6, No. 162, Aug. 25, 1982 & UP, A, 5779552 (Casio Keisanki K.K.) May 18, 1982, see Figures.
Research Disclosure No. 183, Jul. 1979, Havant, Hants, (GB) W. M. Bartolucci et al.: "Snakecode Decoding Circuit" see Figures 1-2.
IEEE Transactions on Communications, vol. COM-30, No. 7, Jul. 1982, New York, (US) Shu Lin et al.: "A Hybrid ARQ Scheme with Purity Re-Transmission for Error Control of Satellite Channels", pp. 1701-1719, see p. 1702.

Primary Examiner—Jerry Smith
Assistant Examiner—Robert W. Beausoliel
Attorney, Agent, or Firm—Nixon & Vanderhye

[57] ABSTRACT

An adaptive system for binary data compression incorporating a coding scheme which is simple to implement, which limits codeword length and which can be implemented by software. Data compression is achieved by assigning four bit codes to the eight most frequently occurring characters in the data and eight or nine bit codes to the remaining characters wherein the code assignment is made according to a continuously updated evaluation of character frequency distribution.

Run length encoding may be used in conjunction with this technique, to achieve further data compression. For transmission, error control protocols are applied to the compressed data where such protocols may include the use of forward error correcting (FEC) coding and an automatic repeat request (ARQ) system. The data may be transmitted using a burst error control system based on interleaving so that a single error correcting FEC coding can corrects bursts of errors characteristic of a telephone system.

23 Claims, 2 Drawing Sheets

HEADER FORMAT

FRAME FORMAT

19 DATA BUS

5 PARITY BITS

DATA TRANSMISSION

This invention relates to the transmission of data in binary digit form.

Data bits can be corrupted during transmission by noise and spurious signals from a variety of sources. Various error detection and correction schemes are known, such as forward error control (FEC) techniques which use a code such as Hamming code to correct a single error. A cyclic redundancy check technique is also known which detects the presence of errors but does not correct them. Automatic repeat request (ARQ) schemes are also known in which a packer of data is checked for errors and, if any are found, a repeat request signal is sent to the transmitter which repeats the transmission until the package is correctly received.

A type of error typical of telephone networks, and exacerbated by modems, is a burst error, in which a string of data bits is corrupted. To correct this type of error it is known to assemble a group of binary codewords of fixed length and transmit them in interleaved form, i.e. transmitting the first bits of each codeword, then the second bits, the third bits, and so on. A burst error which affects several consecutive bits during transmission then appears, when the codewords are reconstituted at the receiver, as a single bit error within each of a number of codewords; such single errors can be corrected by an FEC technique applied to each codeword.

None of the methods in current use, however, achieves an optimum performance. The ARQ system obviously corrects all errors eventually, but the penalty in terms of transmission time can be high especially if the frequency of errors is high and there is a large block length so that much of the information has to be transmitted more than once even if most of it is correct in the first place.

Forward error correcting codes are really practicable only for correcting isolated errors, and even so their use involves a penalty—in common with a cyclic redundancy check methods—in requiring more data to be transmitted than is present in the source data.

The present invention provides an improved error control arrangement for transmitting binary data and especially for doing so over the telephone network.

According to the invention a method of transmitting binary digits, characterised in that it comprises:

forming the binary digits into sections of length N bits, where N has a predetermined maximum value N max;

forming the sections into variable length frames by adding to each section of N bits a set of binary digits which comprise a cyclic redundancy check for detecting errors within that section;

subdividing each variable length frame into codewords of fixed length;

to each codeword adding a fixed number of check bits which allow correction of a known number of errors within that codeword;

interleaving the codewords and their associated check bits, the interleaving depth being dependent on N;

and transmitting the interleaved bits.

It is an advantage of the use of a variable length frame determined by the number of bits N in each section and consequent variable depth of interleaving, that as N increases, the inherent error correction becomes more powerful. With a short frame the interleaving is shallow, but the risk of burst error is low. With a long frame, the deeper interleaving balances the increased risk of a burst error occurring.

Further according to the invention, the digits are counted and the time intervals between digits are measured, the digits being formed into a section whenever either the count reaches the predetermined N max or a predetermined time interval (timeout) is sensed. A time delay may occur either when a human operator is keying-in data and hesitates, or when a computer transmitting data to another computer is subject to an interrupt; in either case the length of the section will be less than N max. If there is no such time delay, than the length of the section will equal N max.

Usually each frame will include an indication of the values of N for the section within the frame, and an indication of the frame sequence number to allow the data to be reconstituted after transmission.

Frequently the binary digits to be transmitted will be binary representations of alphabetic or alphanumeric characters. Text data in binary code e.g. alphanumeric data in ASCII code, has usually a certain amount of redundancy and can be compressed for more efficient transmission using various known techniques.

One known method of compressing text containing runs of some length of repeated characters will be referred to as "run length encoding" and comprises replacing the run with one occurrence of the repeated character, a control character indicating that a run is being encoded, and a number indicating the number of times the character is repeated in the text. Since in general run length encoding can be used in conjunction with other coding methods without interferring with such other methods, and since it is in any event simple to implement, it may as well be used since it can on occasion compress text very substantially.

Other methods of text compression are based on the fact that certain characters occur in text more frequently than others. If the more frequently occurring characters are assigned shorter codes than the less frequently occurring characters, compression can be achieved provided the text is typical, that is to say conforms to the standard text used to set the codes according to the character frequency distribution. Such techniques are known as variable length (VL) coding. Huffman coding is typical and involves assigning symbols of increasing length to increasingly infrequently occurring characters, so that the character which is most likely to occur would receive the code"0", say, and the next most frequent the code "10", the next "110" and so on.

There are a number of problems associated with such coding schemes. One is that the most infrequently occurring characters can have quite long codewords, as the probability is estimated on the basis of historic data and is hence unreliable, so that the coding can become quite inefficient and even result in extension rather than compression of the text if characters with long codewords occur more frequently than in the sample on which the probability distribution was based. Another problem is that code generation and decoding are quite complex.

Various proposals have been made for alleviating problems associated with VL coding, among which may be mentioned modified Huffman-type coding so as to constrain codewords to a maximum length, using Huffman short codes only for the most frequently occurring characters, and using fixed structure code in which codeword lengths are predefined, but characters are distributed amongst the codewords on the basis of a fixed frequency of occurrence.

Adaptive coding has also been proposed as a means of overcoming the problem of the divergence of actual text from the historical code basis. In such schemes the coding is modified according to the characteristics of the source. Although good compression can be achieved implementation has so far proved very difficult, requiring extensive memory, for example, or requiring transmission of the updated code.

The present invention further provides an adaptive coding scheme which does not suffer from these disadvantages, which is simple to implement, which limits codeword length and which can be implemented by software.

Further according to the invention, a method of transmitting binary digits in which the digits represent alphanumeric characters further comprises an initial encoding step of assigning a different 4-bit code to each of the 8 most frequently occurring alphanumeric characters and assigning a different at least 5-bit code to each of the remaining characters, the first bit of each 4-bit code being identical and being different from the first bit of each at least 5-bit code whereby the number of binary digits to be transmitted is reduced.

Preferably the frequency of occurrence of the alphanumeric characters is continuously evaluated, and the assignment of the 4-bit code is intermittently updated, conveniently at the end of a variable length frame. This allows text which does not conform to an expected character distribution e.g. common English language text, to be transmitted with high efficiency.

The aforesaid initial encoding step may be preceded by a prior run length encoding operation. The run length encoding may be such as to replace long sequences of a repeated character by a shorter sequence containing one occurrence of the character, a control character and a number indicating the original sequence length. The maximum repeat count may be set to be one less than the numeric (ASCII) value of the control character, the remainder of longer sequences being encoded as a new sequence, and an occurrence of the control character in the text being encoded as that character repeated once.

Further according to the invention, a method of transmitting data between two active terminals comprises encoding the data for transmission in accordance with the method of the invention at a transmitting terminal, and decoding it at a receiving terminal, the receiving terminal applying the processing steps according to the invention in reverse order to their application by the transmitting terminal.

BRIEF DESCRIPTION OF THE DRAWINGS

A method of and apparatus for compressing and transmitting data according to the invention will now be described, by way of example, with reference to the accompanying drawings, in which.

DETAILED DESCRIPTION OF PRESENTLY PREFERRED EMBODIMENTS

Figure 1:
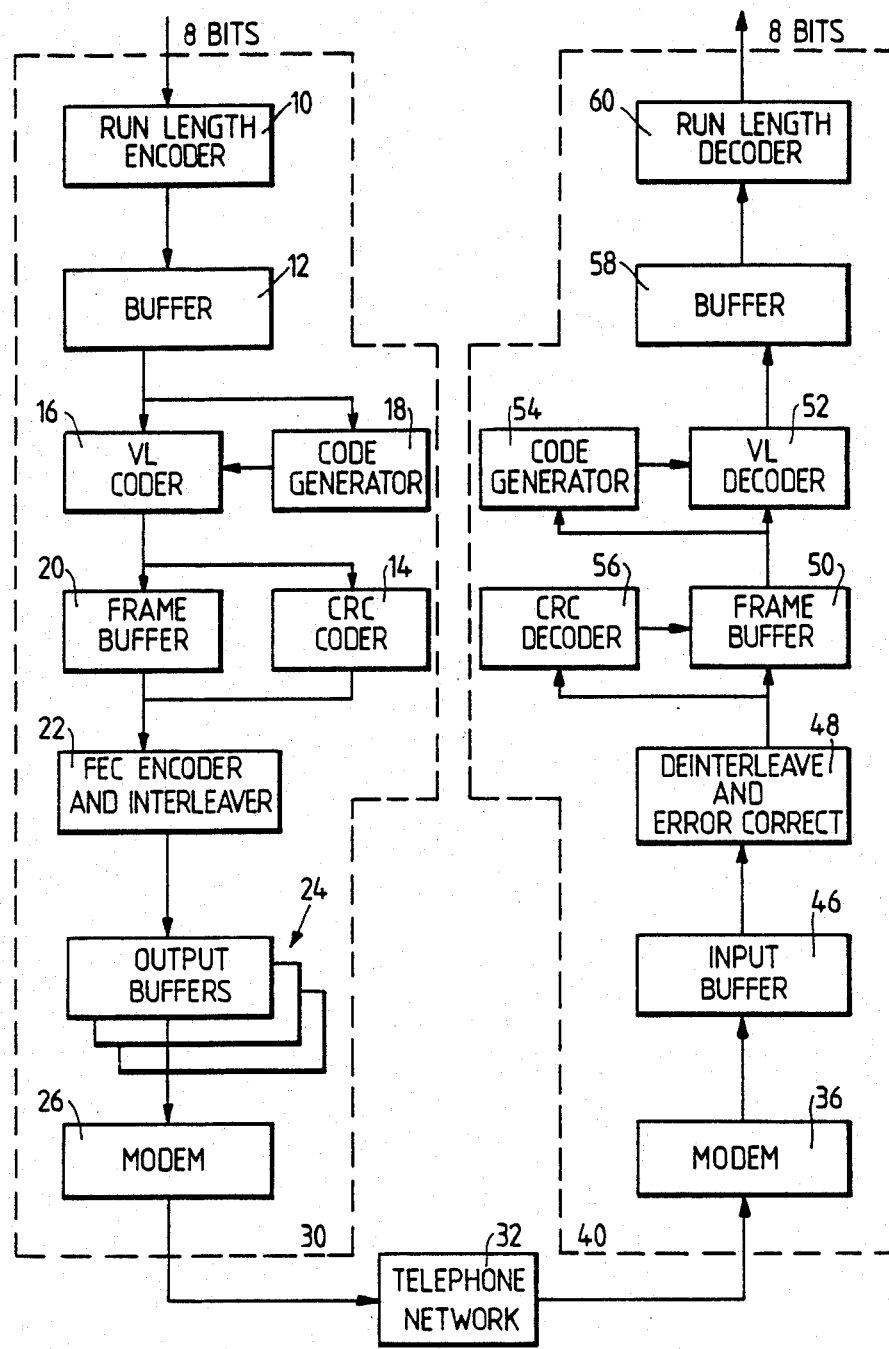
FIG. 1 is a diagrammatic representation of a coding/decoding apparatus.

The data to be encoded and transmitted is assumed to be eight bit, ASCII code applied to alphanumeric characters, which has start and stop bits and a parity bit. Seven bit codes would be treated similarly, however.

The asynchronous character format is

| start bit | data bits | parity bit | stop bit |
|-----------|-----------|------------|----------|
| 0         | 10101101  | 0          | 1        |

The coding operation according to the invention operates after the stripping of the start, stop and parity bits so that for example an eight bit and parity code:
01001101101
becomes 10011011

The apparatus illustrated takes the eight bit sequence as its input. The eight bit sequence is supplied to a run length encoder 10 in which repeated characters are replaced by a shorter representation, i.e. repeated characters are replaced by encoded sequences of three symbols, of which the first is the character itself, the second is a control character (designated here Rc) indicating a run, and the third is the number of occurrences of the character in the run. Thus "aaaa" would be encoded as --a Rc 4--. A run of three repeated characters may be encoded or left as it is—there is no saving to be made either way. A run of two is obviously best left alone.

To permit the control character to appear in the source without automatically triggering a spurious decoding operation, it is conventional to arrange that the maximum repeat count is one less than the numeric value of the ASCII code for the control character. Then an occurrence of the control character in the source can be replaced by two control characters. A sequence longer than the numeric value of the control character can be replaced by shorter sequences.

Thus the input data
 a, b, c, c, d, d, d, e, e, e, e, f (260 times), g, h, Rc, k
would be encoded as
 a, b, c, c, d, Rc, 3, e, Rc, 4, f, Rc, 254, f, Rc, 6, g, h, Rc, Rc, K
compressing 275 characters down to 21.

Of course the above example is untypical, and run length encoding would not ordinarily be expected to achieve such compression. Nevertheless, it is so powerful when it is applicable, and it involves substantially no disadvantages that it is in general beneficial to use it.

After the application of the run length encoding step, the compressed data are supplied to a buffer 12 which passes the data to a variable length coder 16. The coder 16 is in two-way connection with a code generator 18.

The variable length coder 16 is arranged to assign to the eight most frequently occurring characters an 4-bit code, the first bit always being zero. The eight codes are therefore 0000, 0001, 0010, 0011, 0100, 0100, 0101, 0110 and 0111. The remaining characters of the text are all assigned nine bit codes of which the first character is always 1, so that the codes are 100000000, 100000001, . . . 111111111, thus a nine bit codeword consists of the eight bit character code preceded by a 1.

To begin the coding, an assumption is made as to the frequency distribution of the characters in the text e.g. that it is English language. This initial coding is applied to a first section of text, but during the encoding operation a new table of character frequencies is generated by the update coder 18 and supplied to the variable length coder 16; the next section of text is encoded by coder 16 using this new frequency distribution, with the 4-bit codewords assigned to the eight characters which actually appear most frequently in the immediately preceding section of text.

Suppose by way of example the initial assumption of the distribution of character frequencies assigned four bit codewords to:

space, E, e, 0 (zero), 1, t, T, carriage return.

Suppose also that the first section of text to be encoded is "The English Language contains considerable redundancy", supplied in the form of 7 bit ASCII characters.

The characters have these frequencies:

| | | | | |
|---|---|---|---|---|
| space | 5 | l | 3 | |
| E | 1 | n | 7 | |
| T | 1 | o | 2 | |
| a | 5 | r | 2 | |
| b | 1 | s | 3 | |
| c | 3 | t | 1 | |
| d | 3 | u | 2 | |
| e | 5 | y | 1 | |
| g | 3 | | | |
| h | 2 | | 53 | 7 bit characters |
| i | 3 | Total length 53 × 7 bits = 371 bits | | |

The text section would have codewords assigned as follows:

| | | | |
|---|---|---|---|
| space | 0000 | l | 11101100 |
| E | 0001 | n | 111011 |
| T | 0110 | o | 11101111 |
| a | 11100001 | r | 11110010 |
| b | 11100010 | s | 11110011 |
| c | 11100011 | t | 0101 |
| d | 11100100 | u | 11110101 |
| e | 0010 | y | 11111001 |
| f | 11100111 | | |
| h | 11101000 | | |
| i | 11101001 | | |

After this section has been encoded the new frequency table would be used to assign codewords as follows:

| | | | |
|---|---|---|---|
| space | 0001 | l | 11101100 |
| E | 11000101 | n | 0000 |
| T | 11010100 | o | 11101111 |
| a | 0010 | r | 11110010 |
| b | 11100010 | s | 11110011 |
| c | 0100 | t | 11110100 |
| d | 0101 | u | 11110101 |
| e | 0011 | y | 11111001 |
| g | 0110 | | |
| h | 11101000 | | |
| i | 0111 | | |

Figure 3:
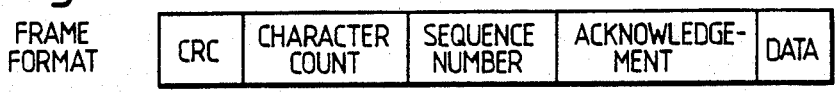
FIG. 3 is a frame format.

The variable length coder 16 supplies data to a frame buffer 20 which has a maximum storage capacity N max, and to a CRC coder 14. When it is decided to stop filling the frame buffer because it is full or a timeout has occurred, the section of data stored in it, of length N bits, is formed into a frame, by addition to the section of a header consisting of a 16 bit cyclic redundancy check code (received from coder 14), an indication of the value N, a sequence number associated with that frame, and an acknowledgement number associated with a reverse channel. The frame format is illustrated in FIG. 3.

Thus the length of each frame is variable, being dependent on the length of the section of data from which it is formed.

Figure 4:
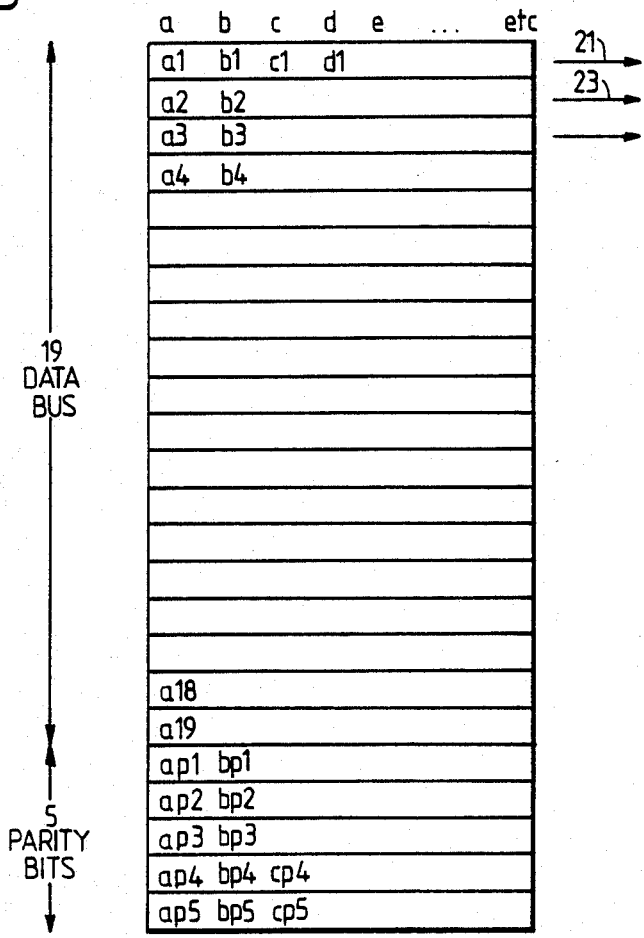
FIG. 4 is a transmission scheme diagram illustrating the interleaving technique.

The next step in the encoding process is to divide each frame into a number of codewords of fixed length, for example 19 bits, and add to each codeword a 5-bit parity word, forming a 24, 19 Hamming code by which one error in the 19 data bits can be corrected. This operation is carried out by an FEC encoder and interleaver 22 connected to the frame buffer 20. The interleaving process applied to the codewords and their associated error correction codes is illustrated in FIG. 4 which shows the codewords a,b,c,d etc each consisting of 19 data bits $a_1$, to $a_{19}$, $b_1$, to $b_{19}$ etc, and each having associated five parity bits, $ap_1$, to $ap_5$; $bp_1$ to $bp_5$ etc. The codewords and parity bits are read out in the direction illustrated by the arrows 21, 23 etc, i.e. the first bit of each codeword in a frame, $a_1$, $b_1$, $c_1$ etc is read out (arrow 21) then the second bit of each codeword so that the codewords are interleaved. The depth of interleaving depends on the number of codewords which is determined by the value of N, and is therefore variable.

Figure 2:
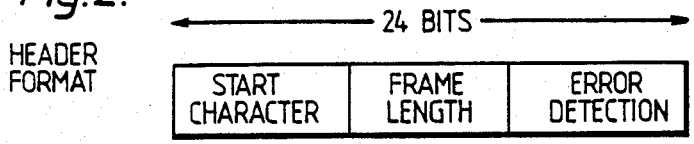
FIG. 2 is a header format.

A header, illustrated in FIG. 2, contains the number of codewords in the transmitted frame (equivalent to the interleaving factor), which is needed to correctly decode the frame. The header, which contains a separate error detection code, is transmitted before the frame to which is corresponds.

The interleaved data is supplied by the encoder and interleaver 22 to a series of output buffers 24 which store the data temporarily and which are connected to a modem 26 which transmits the data through a telephone network. All of the apparatus described above constitutes an encoder and transmitter 30.

The encoder and transmitter 30 is connected, through a telephone network 32 indicated schematically, to a receiver and decoder 40, which decodes the received data by the application of error correction techniques and decoding steps which are the reverse of those applied in the encoder and transmitter 30.

Thus the receiver and decoder 40 contains a modem which supplies data to an input buffer 46 connected to an error corrector 48 which reverses the interleaving process and produces for each codeword a 5-bit number which can, by a known technique, indicate the presence of and correct a single error within the 19-bit codeword.

The interleaved codewords are transmitted as:

$$a_1, b_1, c_1, \ldots a_2, b_2, c_2, \ldots ap_5, bp_5.$$
$$X \ X \ X$$

Suppose X X X indicates an error burst, then when the message is deinterleaved at the receiver using the information contained in the header, it appears as $$(a_1, a_2, a_3, \ldots ap_1, \ldots ap_5)$$
$$X$$
$$(b_1, b_2, b_3, \ldots bp_1, \ldots bp_5)$$
$$X$$
$$(c_1, c_2, c_3, \ldots)$$
$$X$$

The error bits indicated by X now appearing as single errors in the 24 bit codewords that can be corrected automatically by the five parity bits.

The error corrector 48 passes the corrected data to a frame buffer 50 which combines the 19-bit' corrected codewords into a frame, the length of each frame being indicated within its header. The frames are supplied to a variable length decoder 52 which passes the recovered text from the frame to a buffer 58, and also to a code generator 54 and a cyclic redundancy check coder 56.

As has previously been described, the code generator 18 in encoder and transmitter 30 reallocates 4-bit codes to alphanumeric characters intermittently, but only at the end of a frame, when the VL code 16 requests an updated code from the code generator 18. The code generator 54 in receiver 40 operates identically, so that the code applied by variable length coder 52 to decode each frame will be the same as the code used to encode that frame; the code will be changed only after a full frame has been processed.

The decompressed alphanumeric characters from the variable length decoder 52, are sent to a buffer 58 for temporary storage prior to run length decoding and output. The output sequence of characters is thus identical to the original sequence input to coder 10.

The apparatus described contains an automatic repeat request facility, which operates through the frame structure described above. If the cyclic redundancy check decoder 56 detects the presence of errors within the received frame the frame contents are discarded, otherwise the frame contents are passed to the variable length decoder 52 and the received frame sequence number and acknowledgement number retained. The received frame sequence number is returned to the remote transmitter 30 by being placed in the acknowledgement field of the next frame sent in the reverse direction. The received acknowledgement is assumed to indicate correct reception of frames sent in the reverse direction and numbered up to and including the received value, and these frames removed from the transmitter output buffers 24. If no acknowledgement is returned within some predetermined time, the frames stored in the output buffers are retransmitted in an order corresponding to the sequence number contained within the frame.

The use of automatic repeat request and a frame length dependent interleaved forward error correcting code allows the use of longer frames than would normally be regarded as optimal. This reduces the loss in efficiency which can occur on simple automatic repeat request systems, as firstly, fewer frames need retransmitting, and secondly, the ratio of header to data field is improved.

usually the variable length coder 16 will contain a facility for testing whether the application of the variable length code will in fact compress the data to be transmitted, in which case the code is applied, or whether no effective compression will be achieved, when application of the variable length coding feature is withheld.

The scheme may be implemented in software for an eight bit microprocessor. The system can maintain continuous transmission at 1200–2400 bits per second. The transmitter and receiver operate concurrently and substantially independently, the only reverse transmission being the frame acknowledgement or negative acknowledgement.

We claim:

1. A method of coding and transmitting a series of binary digits, characterised in that it comprises:

forming the binary digits into sections of length N bits, where N has a predetermined maximum value N Max;

forming the sections into variable length frames by adding to each section of N bits a set of binary digits which comprise a cyclic redundancy check for detecting errors within that section;

subdividing each variable length frame into codewords of fixed length;

to each codeword adding a fixed number of check bits which allow correction of a known number of errors within that codeword;

interleaving the codewords and their associated check bits, the interleaving depth being dependent on N;

and transmitting the interleaved bits.

2. A method of coding and transmitting binary digits according to claim 1 in which the digits are counted and the time intervals between the digits are sensed, the digits being formed into a section whenever either the count N reaches N max or a predetermined time interval is sensed.

3. A method of coding and transmitting binary digits according to claim 1 or claim 2 further comprising adding to each frame an indication of the value of N for the section within the frame.

4. A method of coding and transmitting binary digits according to claim 3 further comprising adding to each frame an indication of the frame sequence number.

5. A method of coding and transmitting binary digits according to claim 1 in which the binary digits represent alphanumeric characters characterised by further comprising an initial encoding step of assigning a different 4-bit code to each of the 8 most frequently occurring alphanumeric characters and assigning a different at least 5-bit code to each of the remaining characters, the first bit of each 4-bit code being identical and being different from the first bit of each at least 5-bit code whereby the number of binary digits to be transmitted is reduced.

6. A method as in claim 1 wherein said interleaving step includes:

(a) providing a bit sequence of a certain length consisting of the first bit of each of said codewords, (b) providing a bit sequence of said certain length consisting of the next bit of each of said codewords, (c) repeating said providing step (b) until the last bit of each of said codewords has been provided in a bit sequence of said certain length, (d) providing a bit sequence of said certain length consisting of the first of said check bits associated with each of said codewords, (e) providing a bit sequence of said certain length consisting of the next of said check bits associated with each of said codewords, and (f) repeating said providing step (e) until the last of each of said check bits has been provided in a bit sequence of said certain length, wherein said certain length is variable and depends upon said length N.

7. A method as in claim 6 wherein said subdividing step comprises subdividing each variable length frame into more than two codewords of said fixed length.

8. A method of coding, transmitting, receiving and decoding binary digits characterised in that it comprises:

forming the binary digits into sections of length N bits, where N has a predetermined maximum value N max:

forming the sections into variable length frames by adding to each section of N bits a set of binary digits which comprise a cyclic redundancy check for detecting errors within that section;

subdividing each variable length frame into codewords of fixed length;

to each codeword adding a fixed number of check bits which allow correction of a known number of errors within that codeword;

interleaving the codewords and their associated check bits, the interleaving depth being dependent on N;

transmitting the interleaved bits;

receiving the transmitted interleaved bits;

deinterleaving the received bits;

applying the fixed number of check bits to correct a known number of errors within the associated codeword;

forming the error-corrected codewords into a variable length frame;

applying the cyclic redundancy check digits to detect an error in the data bits section within the frame; and forming the corrected data bit sections into a series of binary digits.

9. A method of coding, transmitting, receiving and decoding binary digits according to claim 8 in which the binary digits represent alphanumeric characters in which:

before transmission there is applied an initial encoding step of assigning a different 4-bit code to each of the 8 most frequently occurring alphanumeric characters and assigning a different at least 5-bit code to each of the remaining characters, the first bit of each 4-bit code being identical and being different from the first bit of each at least 5-bit code whereby the number of binary digits to be transmitted is reduced; and after receipt there is applied an equivalent decoding step.

10. A method of coding, transmitting, receiving and decoding binary digits according to claim 9 further comprising continuously evaluating the frequency of occurrence of the alphanumeric characters, and intermittently altering the assignment of the 4-bit and at least 5- bit codes, said alteration being arranged so that the same assignment of codes is applied to encode and to decode the binary digits.

11. Apparatus for transmitting a series of binary digits, characterised in that it comprises:

frame buffer means (20) for forming the binary digits into sections of length N bits, Where N has a predetermined maximum value N max;

CRC coder means (14) for supplying sets of binary digits which comprise a cyclic redundancy check which is added to the sections of length N bits contained within frame buffer (20);

encoding and interleaving means (22) for subdividing each variable length frame into codewords of fixed length, for adding to each codeword a fixed number of check bits, and for interleaving the codewords and their associated check bits, the interleaving depth being dependent on N; and transmission means (24,26) for transmitting the interleaved bits.

12. Apparatus according to claim 14 further comprising initial encoding means (14,16) for applying to binary digits which represent alphanumeric characters an initial encoding step of assigning a different 4-bit code to each of the 8 most frequently occurring alphanumeric characters and assigning a different at least 5-bit code to each of the remaining characters, the first bit of each 4-bit code being identical and being different from the first bit of each at least 5-bit code whereby the number of binary digits to be transmitted is reduced.

13. Apparatus for receiving and decoding a series of binary digits comprising:

receiving means (36,46) for receiving interleaved codewords of fixed length within a variable length frame;

deinterleaving and error correction means (48) for deinterleaving the received codewords based on an interleave depth dependent on a frame length N and applying a fixed number of check bits to correct a known number of errors within a codeword;

frame buffer means (50) for forming the error-corrected codewords into a frame of said length N;

CRC decoder means (56) for applying a cyclic redundancy check to the received frame and for detecting the presence of uncorrected errors;

variable length decoder means (52) for decoding said received frame into data bit sections;

buffer means (58) for temporary storage of the data bit sections;

and run length decoding means (60) for further decoding said data bit sections.

14. A method of coding and transmitting a series of binary digits representing alphanumeric characters comprising:

assigning a different 4-bit code to each of the eight most frequently occurring alphanumeric characters;

assigning a different at least 5-bit code to each of the remaining characters not included in the eight most frequently used characters, the first bit of each of said 4-bit codes being different from the first bit of any of said 5-bit codes;

initially encoding said series of binary digits in accordance with said assignments to provide a second series of binary digits which is of reduced length;

forming said second series of binary digits into sections of length N bits where N has a predetermined maximum value N max;

forming the sections into variable length frames by adding to each section of N bits a set of binary digits which comprise a cyclic redundancy check for detecting errors within that section;

subdividing each variable length frame into codewords of fixed length;

to each codeword adding a fixed number of check bits which allow correction of a known number of errors within that codeword;

interleaving the codewords and their associated check bits, the interleaving depth being dependent on N; and transmitting the interleaved bits.

15. A method of coding and transmitting binary digits according to claim 14 further comprising continuously evaluating the frequency of occurrence of the alphanumeric characters, and intermittently altering the assignment of the 4-bit and at least 5-bit codes.

16. A method of coding and transmitting binary digits according to claim 15 in which the intermittent alteration of the assignment of the 4-bit and at least 5-bit codes occurs after the transmission of all interleaved codewords within a variable length frame.

17. A method of coding and transmitting binary digits according to claim 16 in which the binary digits to be transmitted are eight-bit ASCII code, and the at least 5-bit code is 9-bit code.

18. A method of coding and transmitting binary digits according to claim 16 in which the binary digits to be transmitted are seven-bit ASCII code and the at least 5-bit code is 8-bit codes.

19. A method of coding and transmitting binary digits according to claim 14 in which the initial encoding step is preceded by the application to the alphanumeric characters to be transmitted of a prior run length encoding step, by which a run of a repeated character is replaced by a shorter sequence comprising one occurrence of said character, a control character indicating a run, and an indication of the length of the run.

20. A method of coding and transmitting binary digits according to claim 14 wherein said forming step comprises counting the digits and sensing the time intervals between the digits, said forming step forming the digits into a section whenever either the count N reaches N max or a predetermined time interval is sensed.

21. A method of coding and transmitting binary digits according to claim 20 further comprising adding to each frame an indication of the value of N for the section within the frame.

22. A method of coding and transmitting binary digits according to claim 21 further comprising adding to each frame an indication of the frame sequence number.

23. Apparatus for receiving and decoding a series of binary digits comprising:
   receiving means (36,46) for receiving interleaved codewords;
   deinterleaving and error correction means (48) for deinterleaving the received codewords and applying a fixed number of check bits to correct a known number of errors within a codeword;
   frame buffer means (50) for forming the error-corrected codewords into a frame of length N;
   CRC decoder means (56) for applying a cyclic redundancy check to the received frame and for detecting the presence of uncorrected errors;
   variable length decoder means (52) for decoding said received frame into data bit sections;
   buffer means (58) for temporary storage of the data bit sections;
   and run length decoding means (60) for further decoding said data bit sections.

* * * * *